(12) United States Patent
Goh et al.

(10) Patent No.: US 9,209,152 B2
(45) Date of Patent: Dec. 8, 2015

(54) MOLDING MATERIAL AND METHOD FOR PACKAGING SEMICONDUCTOR CHIPS

(71) Applicant: Infineon Technologies AG, Neubiberg (DE)

(72) Inventors: Kok Chai Goh, Melaka (MY); Meng Tong Ong, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 134 days.

(21) Appl. No.: 13/866,811

(22) Filed: Apr. 19, 2013

(65) Prior Publication Data

US 2014/0312497 A1  Oct. 23, 2014

(51) Int. Cl.
| | |
|---|---|
| *H01L 23/00* | (2006.01) |
| *H01L 23/28* | (2006.01) |
| *H01L 23/495* | (2006.01) |
| *H01L 23/60* | (2006.01) |
| *H01L 23/36* | (2006.01) |
| *H01L 23/31* | (2006.01) |
| *H01L 21/56* | (2006.01) |

(52) U.S. Cl.
CPC ............... *H01L 24/27* (2013.01); *H01L 23/28* (2013.01); *H01L 23/3135* (2013.01); *H01L 23/36* (2013.01); *H01L 23/49524* (2013.01); *H01L 23/60* (2013.01); *H01L 24/31* (2013.01); *H01L 24/40* (2013.01); *H01L 24/84* (2013.01); *H01L 24/96* (2013.01); *H01L 24/97* (2013.01); *H01L 21/561* (2013.01); *H01L 21/568* (2013.01); *H01L 23/3107* (2013.01); *H01L 24/37* (2013.01); *H01L 2224/04034* (2013.01); *H01L 2224/056* (2013.01); *H01L 2224/05647* (2013.01); *H01L 2224/24245* (2013.01); *H01L 2224/37147* (2013.01); *H01L 2224/37611* (2013.01); *H01L 2224/4005* (2013.01); *H01L 2224/40101* (2013.01); *H01L 2224/40105* (2013.01); *H01L 2224/40245* (2013.01); *H01L 2224/84002* (2013.01); *H01L 2224/84005* (2013.01); *H01L 2224/848* (2013.01); *H01L 2224/84801* (2013.01); *H01L 2224/84897* (2013.01); *H01L 2224/96* (2013.01); *H01L 2224/97* (2013.01); *H01L 2924/1306* (2013.01); *H01L 2924/13091* (2013.01)

(58) Field of Classification Search
CPC ..... H01L 23/3135; H01L 23/28; H01L 24/27; H01L 24/31; H01L 23/49524; H01L 24/97; H01L 23/49562; H01L 23/49548; H01L 21/568; H01L 24/73; H01L 24/92; H01L 24/40
USPC .................................................. 438/121, 123
See application file for complete search history.

(56) References Cited

U.S. PATENT DOCUMENTS

2010/0044845 A1* 2/2010 Funaya et al. ................ 257/685

* cited by examiner

*Primary Examiner* — Ermias Woldegeorgis
(74) *Attorney, Agent, or Firm* — Slater & Matsil, LLP (57) ABSTRACT

A method and apparatus for packaging a semiconductor chip is presented. A semiconductor device includes a chip, a lead, and an encapsulant. The encapsulant includes a stabilization layer, a laminate molding layer connected to the stabilization layer, and a conductive strip connected to the laminate molding layer. The conductive strip electrically connects the contact area of the chip to the lead.

23 Claims, 8 Drawing Sheets

MOLDING MATERIAL AND METHOD FOR PACKAGING SEMICONDUCTOR CHIPS

TECHNICAL FIELD

The present invention relates generally to semiconductor devices. In particular, embodiments of the present invention relate to a method and apparatus for packaging semiconductor chips.

BACKGROUND

In the field of semiconductor chip packaging, an increased desire can be observed to package a semiconductor chip in a way that meets the individual needs of consumers. Industrial consumers have a desire to efficiently package semiconductor chips such that the resulting devices have a reduced size while maintaining the same robust performance.

In a semiconductor chip package, the semiconductor chip, or die, is embedded or housed within the chip package and the contact pads of the semiconductor chip are connected to external contact elements of the chip package. It is desirable to produce semiconductor chip packages so that their external contact elements allow a higher degree of flexibility with regard to the attachment of the semiconductor chip package to a board. It is also desirable to increase the modular applicability of the semiconductor chip package and, in particular, the possibility to connect further devices to the semiconductor chip package.

The semiconductor chip packaging process involves a number of different steps. For example, once a semiconductor chip is disposed on a lead frame or carrier, the semiconductor chip is wire bonded, encapsulated, and sawed such that a semiconductor chip package is produced. These steps occur sequentially and have output and quality limitations particular to each step. For instance, the wire bonding process occurs wire by wire and clip by clip. Thus, only a certain number of units may be produced over a period of time and consequently, only a certain level of cost savings may be realized using currently available packaging methods.

Further, the addition of other components within the semiconductor chip package increases the duration and complexity of the packaging process. For example, with the use of power semiconductor devices, it may be desirable to connect the semiconductor chip to a thermally conductive device such as a heat sink. The use of a heat sink results in additional complexity of the packaging process. As a result, the semiconductor chip device may not be packaged as efficiently as desired. Consequently, there is a general need for cost-efficient solutions in packaging semiconductor chips such that more units are produced in a shorter period of time.

SUMMARY OF THE INVENTION

In accordance with an embodiment of the present invention, a semiconductor device comprises a chip, a lead, and an encapsulant. The encapsulant comprises a stabilization layer (e.g., fiberglass), a laminate molding layer connected to the stabilization layer, and a conductive strip (e.g. copper) connected to the laminate molding layer. The conductive strip electrically connects the chip to the lead.

In accordance with another embodiment of the present invention, a method for packaging a semiconductor device is presented. A chip is attached to a lead frame. A molding material is placed on the lead frame and the chip. The molding material is comprised of a stabilization layer, a laminate molding layer surrounding or otherwise connected to the stabilization layer, and a conductive strip connected to the laminate molding layer such that the conductive strip is associated with the chip. The chip and the lead frame are encapsulated by attaching the molding material to the lead frame and the chip such that ones of the conductive strips electrically connect the chip to leads of the lead frame.

In accordance with yet another embodiment of the present invention, a method for packaging a semiconductor device is provided. A carrier is provided with a plurality of conductive strips attached thereto. The conductive strips are attached between contact areas of a chip and leads. The carrier is removed. The chip and the conductive strips are encapsulated with a molding material to form a semiconductor chip package.

In accordance with still another embodiment of the present invention, a method for packaging a semiconductor device is provided. A plurality of leads is formed on a chip carrier. A plurality of chips is placed on the chip carrier. A strip carrier is aligned with the chip carrier such that conductive strips of the strip carrier are aligned to electrically connect contact regions of the chips with respective ones of the leads. The strip carrier is applied to the chip carrier such that a coating material of the strip carrier encapsulates the chips and so that the conductive strips electrically connect the contact regions of the chips with the respective ones of the leads. The chip carrier is removed so as to expose a portion of each of the leads.

In accordance with yet another embodiment of the present invention, a molding material comprises a stabilization layer, a laminate molding layer connected to the stabilization layer, and a conductive film layer connected to the laminate molding layer.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention and do not limit the scope of the invention.

In various embodiments, the present invention teaches a process for packaging a semiconductor chip such that the wire bonding process and the encapsulating process occur at substantially the same time. Various embodiments use a novel molding material containing a bonding component to electrically connect the semiconductor chip to a number of leads and encapsulate the semiconductor chip package in one step, thereby increasing the efficiency of the packaging process. Moreover, various embodiments obviate the need for the wire-by-wire bonding step and allow for one-shot wire bonds for an entire lead frame, panel, or wafer. As a result, embodiments of the present invention increase the output of semiconductor chip packages while maintaining the desired size and robust performance of the semiconductor device.

Figure 1:
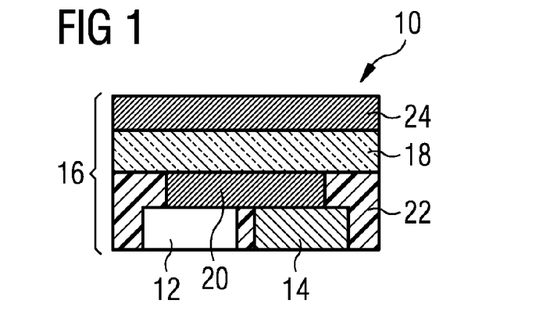
FIG. 1 is an illustration of an embodiment of a semiconductor chip package containing a single chip.

Turning first to FIG. 1, a semiconductor chip package 10 includes a chip 12, a lead 14, and a molding material 16. In this illustration, the chip 12 and the lead 14 have been encapsulated using the molding material 16. The encapsulated device has been sawed, or diced, to form the semiconductor chip package 10.

The chip 12 may be a variety of different types of chips. For example, the chip 12 may be a discrete device such as a metal oxide semiconductor field-effect transistor (MOSFET), a diode, or some other suitable type of chip. In other embodiments, the chip 12 can be an integrated circuit, e.g., logic chip, such as a controller or a processor, a memory, or any other device. Alternate implementations of the lead 14 are described below.

In one embodiment, electrical connection from outside the package can be made directly to the lead 14. In other embodiments, such as the semiconductor chip package shown in FIG. 8C, the lead 14 may be connected to a lead frame.

As depicted, the molding material 16 comprises a stabilization layer 18, a conductive strip 20, a laminate molding layer 22, and a second conductive layer 24. The stabilization layer 18 maintains a minimum thickness of the molding material, which provides stability during the encapsulation of the chip 12 and the lead 14. The stabilization layer 18 may be comprised of a glass-reinforced plastic (e.g., fiberglass), a polyester resin with a desired percentage of E-glass content, and other suitable materials.

In one embodiment, the conductive strip 20 may be formed from a conductive film layer attached to the stabilization layer 18. A plurality of conductive strips may be formed from the conductive film in addition to the conductive strip 20. The conductive strip 20 electrically connects the chip 12 to the lead 14.

In this example, the chip 12 has substantially the same height as the lead 14. As a result, the conductive strip 20 does not need to be manipulated to provide the electrical connection between the chip 12 and the lead 14. Instead, the conductive strip 20 is configured such that it attaches to the upper surface of the chip 12 and the upper surface of the lead 14. Thus, contacts of the chip 12 to the lead 14 can be electrically connected.

In some embodiments, the chip 12 may not have substantially the same height as the lead 14. In this case, the conductive strip 20 may be manipulated to compensate for the height different of the chip 12 relative to the lead 14. As an example, the conductive strip 20 may be bent such that it contacts both the chip 12 and the lead 14, molding material may fill the gap between the conductive strip 20 and the smaller component, or a combination thereof.

The length of the conductive strip 20 depends on a number of different factors. For example, the length of the conductive strip 20 may depend on the space between the associated contact on the chip 12 and the lead 14, a desired overlap of the conductive strip 20 on the chip 12 and/or the lead 14, or some other suitable factor. In one implementation of an illustrative embodiment, the conductive strip 20 can have a length of 200 µm, e.g., between 150 µm and 300 µm. Of course, the conductive strip 20 may have different lengths in other illustrative embodiments, depending on package design. A typical implementation will include multiple conductive strips, which may be the same or different lengths.

The conductive strip 20 may have a number of different thicknesses as well, depending on the functionality of the semiconductor chip package 10. For example, a power device that conducts a large amount of current will typically have thicker (and/or wider) leads than a logic chip. Example thicknesses of the conductive strip 20 include thicknesses between about 25 µm to about 700 µm. During the manufacturing process, the molding material 16 is aligned over the chip 12 and the lead 14 taking into account these parameters.

In this depicted example, the conductive strip 20 is part of the molding material 16 and may take the place of a wire-by-wire bond between contacts of the chip 12 and the leads 14. Thus, in this embodiment, the chip 12 and the lead 14 are electrically connected during the encapsulation process rather than during a separate wire bonding step. The laminate molding layer 22 of the molding material 16 encapsulates the semiconductor chip package 10 such that the conductive strip 20 does not move. No solder or bonding material is necessary to secure the conductive strip 20 to the chip 12 or the lead 14 in these examples.

In other embodiments, wire bonding material may be used to secure the conductive interconnect, depending on the type of conductive material included in the conductive strip 20. In this case, wire bonding and molding are performed in one step.

The laminate molding layer 22 is comprised of a laminate material configured to flow into the gaps between components within the semiconductor chip package 10. For example, when heated, the laminate molding layer 22 will fill the gaps between the chip 12 and the lead 14, the chip 12 and the stabilization layer 18, the lead 14 and the stabilization layer 18, other chips or leads in the semiconductor chip package 10, or some combination thereof. In this manner, molding material 16 with laminate molding layer 22 fully encapsulates the chip 12 and the lead 14 to form the semiconductor chip package 10.

In other examples, the laminate material may flow into the gaps between the components in the semiconductor chip package 10 when molding material 16 is pressure sintered to the chip 12 and the lead 14. In some examples, the molding material 16 is heated to a temperature not exceeding 250 degrees Celsius. Of course, other temperatures may be used. Further, the molding process may be performed under a desired amount of pressure and/or in a vacuum environment.

When the molding material 16 is in sheet form, the laminate molding layer 22 may be connected to the stabilization layer 18 such that the stabilization layer 18 is between the second conductive layer 24 and the laminate molding layer 22. Alternatively, the laminate molding layer 22 may surround the stabilization layer 18 within the molding material 16.

The laminate material in the laminate molding layer 22 may be several different types of material. For example, the laminate molding layer 22 may include a polyester resin, an epoxy, or other suitable polymer-based materials for encapsulating the chip 12 and the lead 14.

In this example, the second conductive layer 24 is configured to provide radio-frequency shielding. The second conductive layer 24 also may provide heat precipitation. This second conductive layer 24 can be any conductive material such as copper, aluminum, or another type of conductive metal.

Although the molding material 16 is shown with four layers in this illustrative example, more or fewer layers may be present. For instance, with some implementations of an illustrative embodiment, the second conductive layer 24 is optional. Further, the molding material 16 may be comprised of additional layers, depending on the particular implementation.

Additionally, the configuration of layers illustrated in FIG. 1 is not intended to limit the manner in which an illustrative embodiment may be implemented. In this example, the stabilization layer 18 is shown slightly thicker than the second conductive layer 24. These layers may be thinner, thicker, or substantially the same thickness as each other in other examples of an illustrative embodiment. Parameters for thickness and length of layers in the molding material may be defined by manufacturing guidelines and preferences.

Figure 2:
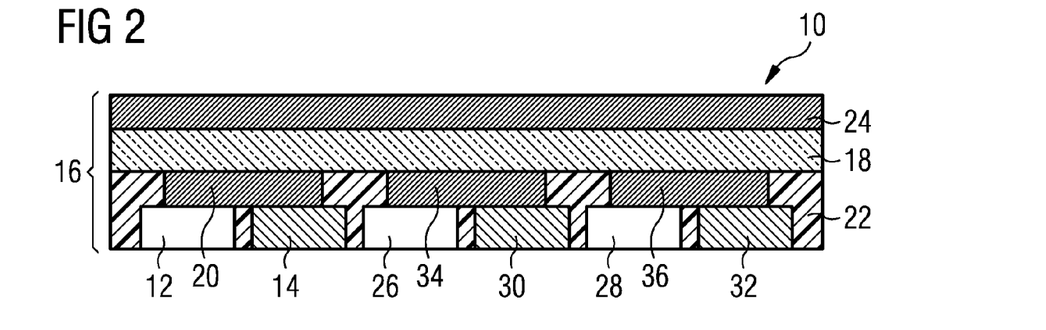
FIG. 2 is an illustration of an embodiment of a semiconductor chip package containing multiple chips.

FIG. 2 illustrates the semiconductor chip package 10 with the chip 12, a chip 26, and a chip 28. Further, the semiconductor chip package 10 includes a lead 30 and a lead 32 in addition to the lead 14.

In this depicted example, the molding material 16 is used to electrically connect and encapsulate each chip with a corresponding lead. Specifically, the molding material 16 comprises a conductive strip 34 to electrically connect the chip 26 to the lead 30 and a conductive strip 36 to electrically connect the chip 28 to the lead 32. The laminate molding layer 22 fills the space between the components as described in FIG. 1.

Although three chips are shown in this example, other numbers of chips and leads may be included in the semiconductor chip package 10. For example, two chips, four chips, six chips, ten chips, or some other number of chips may be present.

Figure 3:
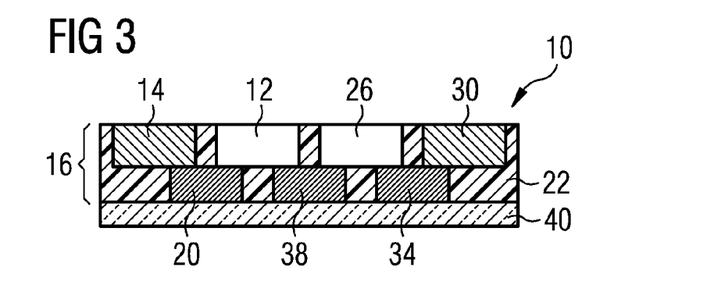
FIG. 3 is another illustration of an embodiment of a semiconductor chip package containing multiple chips.

FIG. 3 illustrates the semiconductor chip package 10 with the chip 12 connected to the lead 14 and the chip 26 connected to the lead 30 using the conductive strip 20 and the conductive strip 34, respectively. In this view, the chip 12 and the chip 26 are also electrically connected to each other by a conductive strip 38.

In this example, the conductive strip 20, the conductive strip 34, and the conductive strip 38 are implemented using a carrier 40. The carrier 40 is comprised of a non-conductive, porous metal with good heat transfer. For example, the carrier 40 may be comprised of aluminum oxide, or other suitable materials. When the carrier 40 is comprised of a porous metal, the carrier 40 may be used for increased heat transfer for the semiconductor chip package 10.

As depicted, the semiconductor chip package 10 is encapsulated using the molding material 16 with the laminate molding layer 22. The laminate material in the laminate molding layer 22 also penetrates the porous metal in the carrier 40. Because the conductive strip 20, the conductive strip 34, and the conductive strip 38 are attached to the carrier 40, the molding material 16 is not comprised of any additional conductive strips in this particular example.

Figure 4:
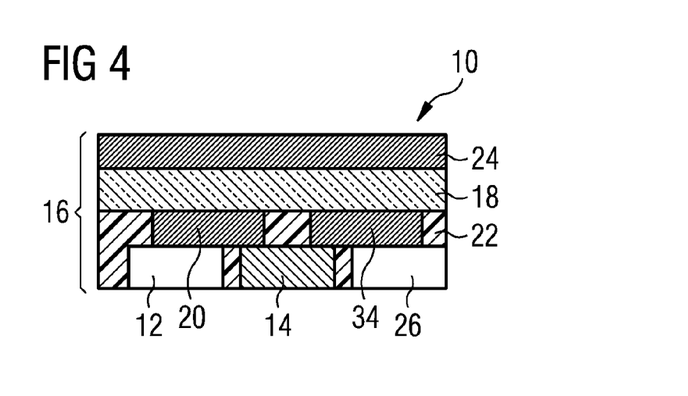
FIG. 4 is yet another illustration of an embodiment of a semiconductor chip package containing multiple chips.

FIG. 4 shows the chip 12 and the chip 26 electrically connected to the lead 14. In this example, the conductive strip 20 connects the chip 12 to the lead 14. Similarly, the conductive strip 34 connects the chip 26 to the lead 14. In other examples, additional chips and leads may be provided such that each lead is connected to two chips. Of course, other combinations and connections between chips and leads may be realized with the use of an illustrative embodiment.

Figure 5:
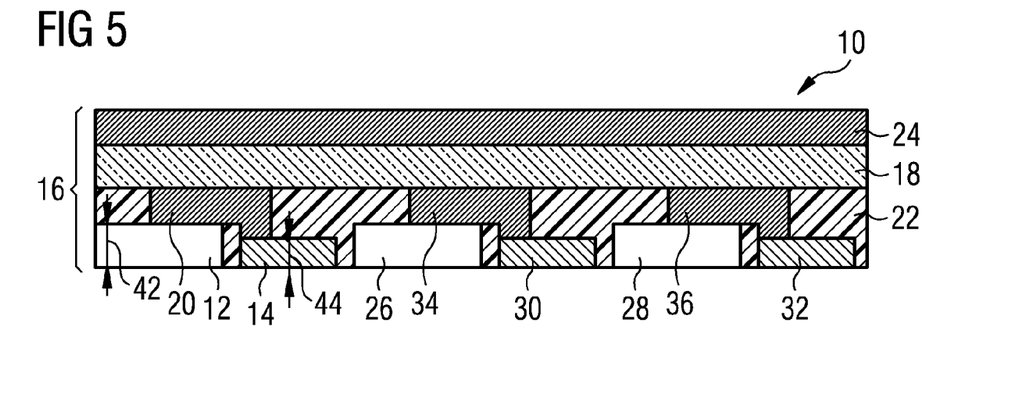
FIG. 5 is an illustration of an embodiment of a semiconductor chip package with bent conductive strips.

FIG. 5 illustrates the semiconductor chip package 10 with chips and leads of different heights. The height of the chips may increase or decrease based on the complexity of the chips. For example, a more complex chip may have a greater height than a less complex chip.

In this illustration, a height 42 of the chip 12 is greater than a height 44 of the lead 14. As an example, height 42 of the chip 12 may be 200 microns, while height 44 of the lead 14 may be 50 microns. Of course, other heights of the chip 12 and the lead 14 may be provided. A preferred height difference between the chip 12 and the lead 14 would be about 100 microns or less.

With this configuration of the chip 12 and the lead 14, the conductive strip 20 may not electrically connect the chip 12 with the lead 14 in the same manner as described in FIGS. 1-4. Thus, the conductive strip 20 is bent to compensate for the difference between height 42 and height 44 such that bent conductive strip 20 electrically connects the chip 12 with the lead 14 in a desired manner. Likewise, the conductive strip 34 and the conductive strip 36 are bent to provide the desired connection between the chips and leads. In this example, the conductive strips should be bent such that a distance of less than 50 microns exists between the conductive strip and the lead.

The bending of the conductive strip 20, the conductive strip 34, and the conductive strip 36 may occur prior to or during the encapsulation process. Further, the conductive strip 20, the conductive strip 34, and the conductive strip 36 may be bent the same distance or a different distance, depending on the difference in height between each chip and the corresponding leads. In some cases, the conductive strip 38 in FIG. 3 may also require bending to connect the chip 12 with the chip 26.

With the use of an illustrative embodiment, the molding material 16 may encapsulate a variety of different types of chips and leads. The bending of the conductive strips allows chips of different sizes or complexities to be used in the same device while maintaining a simplified manufacturing process.

Figure 6:
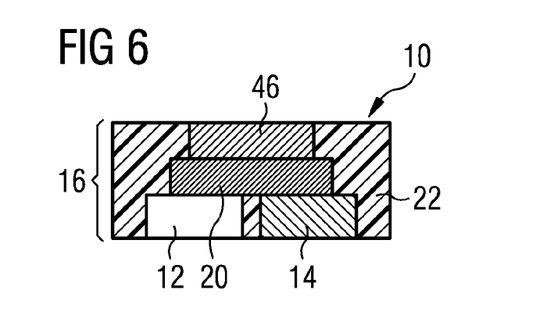
FIG. 6 is an illustration of an embodiment of a semiconductor chip package with a single chip and a heat sink.

FIG. 6 shows the semiconductor chip package 10 including a heat sink 46. In this example, the conductive strip 20 is connected to the heat sink 46. Use of the heat sink 46 may be desired to dissipate heat generated by the chip 12.

As depicted, the molding material 16 encapsulates the heat sink 46 in addition to the chip 12, the lead 14, and the conductive strip 20. The conductive strip 20 and the heat sink 46 are attached to the chip 12 and the lead 14 prior to encapsulation. Consequently, the molding material 16 does not comprise a separate conductive strip in this illustrative example. In another example, the heat sink 46 can be above the laminate molding layer 22.

Figure 7:
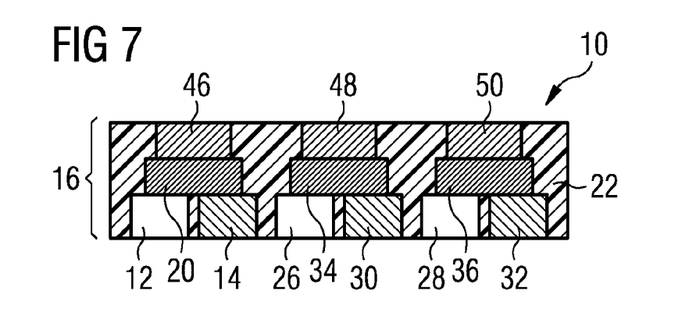
FIG. 7 is an illustration of an embodiment of a semiconductor chip package with multiple chips and multiple heat sinks.

FIG. 7 illustrates the semiconductor chip package 10 further comprising a heat sink 48 and a heat sink 50. As shown in this figure, the heat sink 48 is connected to the conductive strip 34 and the heat sink 50 is connected to the conductive strip 36. The heat sink 48 and the heat sink 50 dissipate heat generated by the chip 26 and the chip 28, respectively. As a result, the heat sink 46, the heat sink 48, and the heat sink 50 may reduce the risk of damage to the chip 12, the chip 26, and the chip 28 from heat. Additionally, the heat sink 46, the heat sink 48, and the heat sink 50 may reduce the risk of heat damage to other components within the semiconductor chip package 10 or connected to the semiconductor chip package 10.

Figure 8A:
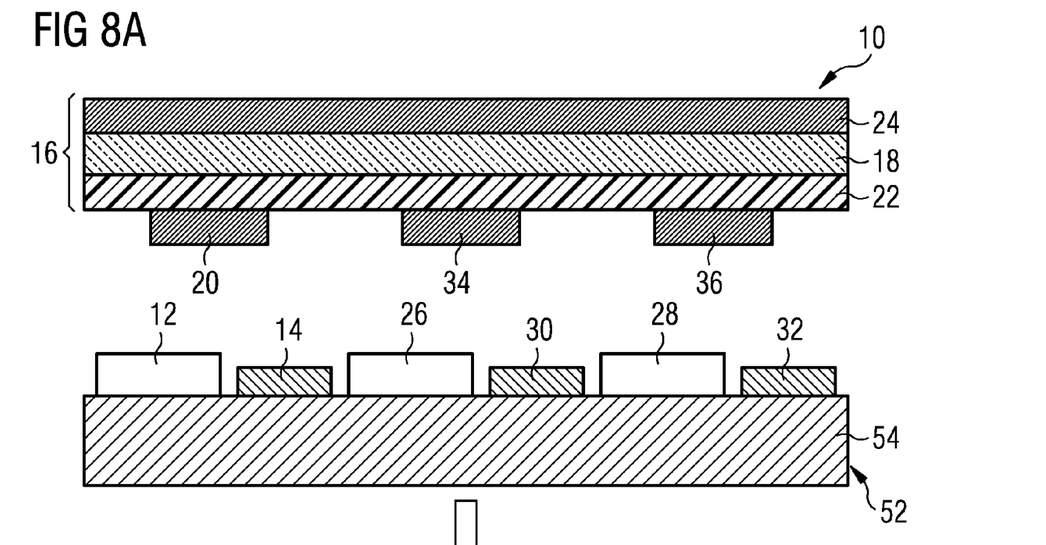
FIGS. 8A and 8B are illustrations of a process for packaging semiconductor chips.
Figure 8B:
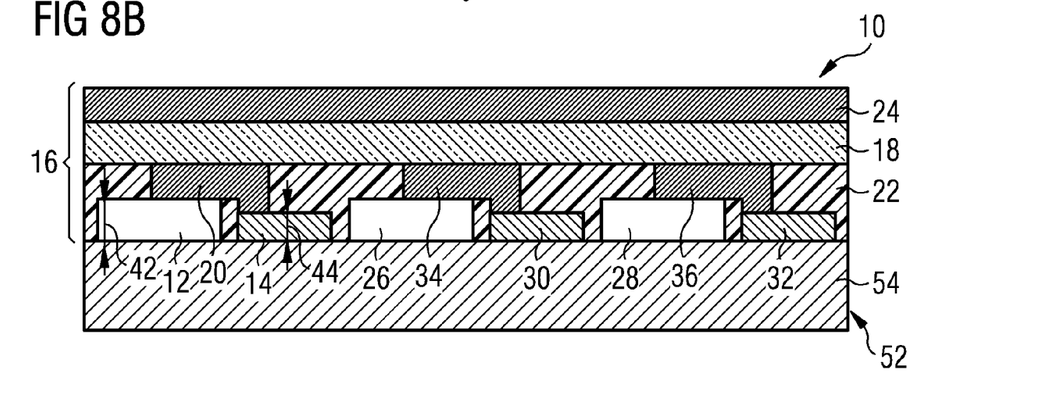

FIGS. 8A and 8B schematically illustrate a method for forming the semiconductor chip package 10 shown in FIG. 5. The process illustrated in FIGS. 8A and 8B is not meant to limit the order of the steps or the manner in which this method may be performed.

Particularly, FIG. 8A provides a carrier 52 with the chip 12, the chip 26, and the chip 28 bonded to the carrier 52. In this example, the carrier 52 is a lead frame 54 with the lead 14, the lead 30, and the lead 32 formed on the lead frame 54.

As depicted, the molding material 16 is in sheet form. Thus, the molding material 16 may be easily placed on top of the lead frame 54 during manufacturing of the semiconductor chip package 10. The laminate molding layer 22 is located between the conductive strips and the stabilization layer 18. The laminate molding layer 22 also may surround the stabilization layer 18.

Figure 13A:
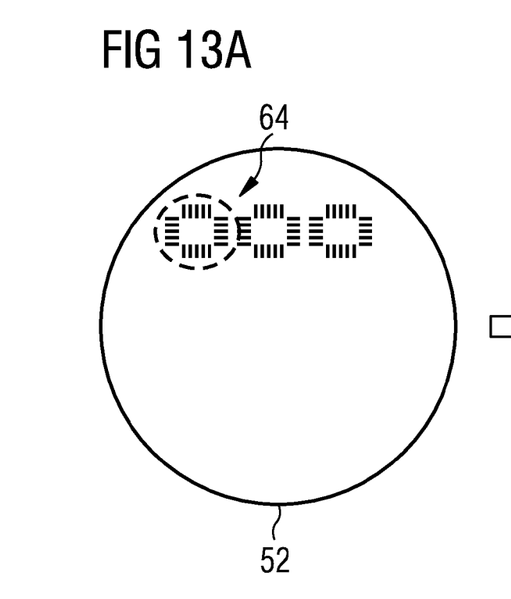
FIGS. 13A-13C are illustrations of a process for packaging multiple semiconductor chips at the same time.
Figure 13B:
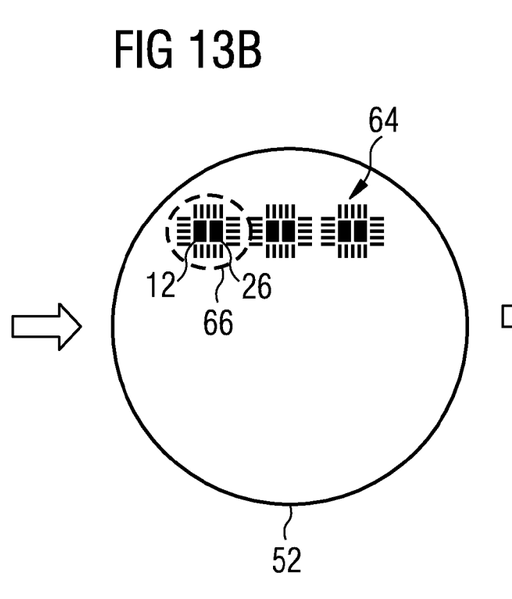
Figure 13C:
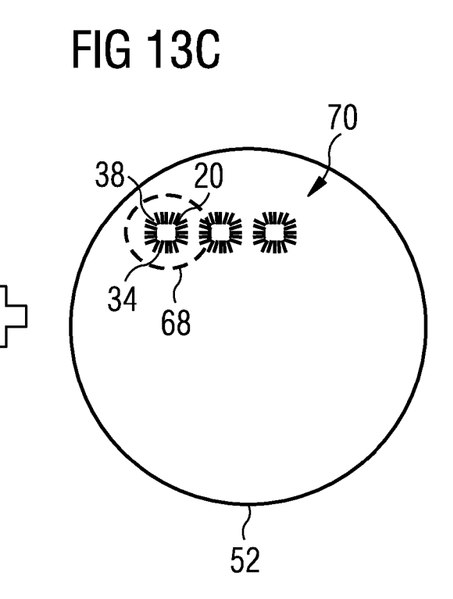

In this example, the molding material 16 has been aligned on the lead frame 54 such that the conductive strip 20, the conductive strip 34, and the conductive strip 36 correspond with the desired chip and the desired lead. Alternatively, the chip 12, the chip 26, and the chip 28 may be bonded to the lead frame 54 such that a predetermined distance is present between the chips and the corresponding leads. This predetermined distance may be based on the length of the conductive strip connecting the chip to the lead. As an example, the chip 12, the chip 26, and the chip 28 may be cold die attached to the lead frame 54 with a placement accuracy of 25 µm (3 sigma). A plan view of carrier 52 is shown in FIGS. 13A-13C, described in detail below.

The molding material 16 is then attached to the lead frame 54 to form the semiconductor chip package 10. The molding material 16 may be attached to the lead frame 54 in a variety of different ways. For example, the molding material 16 may be attached to the lead frame 54 using a pressure sintering process, a pressure lamination process, and other methods.

In particular, the components may be connected to one another using a number of different types of interconnect technologies. For example, the chip may be connected to the conductive strip using methods such as Cu—Cu interconnect, solderable front side and Cu strip, eutectic front side and Cu strip, and other techniques. The conductive strip may be connected to the lead using Cu strip to lead eutectic processes (e.g., Sn plating on Cu), Cu strip to Cu lead, Cu strip to lead with uPPF plating, and other techniques.

If the height of the chips is greater than the height of the leads (or vice versa), the conductive strips are bent before or during encapsulation. For example, these conductive strips may be bent within 50 microns of the leads in order to electrically connect the chips to the leads.

FIG. 8B illustrates the semiconductor chip package 10 during encapsulation. The laminate material in the laminate molding layer 22 flows into the gap within the chips and the leads.

The conductive strip 20 may be bent to compensate for the height difference between the chip 12 and the lead 14. The stabilization layer 18 is used as a thickness control during the encapsulation process.

In this manner, the semiconductor chip package 10 may be bonded and encapsulated during the same step using the molding material 16. Thus, steps may be eliminated from the manufacturing process and cost savings may be realized.

Figure 8C:
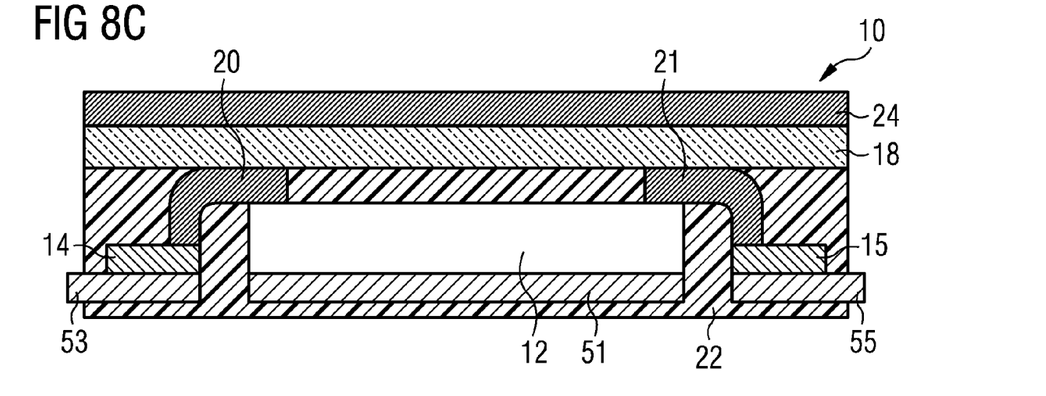
FIG. 8C is an illustration of an embodiment of a semiconductor chip package that includes a lead frame.

In FIG. 8C, the semiconductor chip package 10 has been singulated from the other chip packages shown in FIG. 8B. In this view, the chip 12 is also connected to a lead 15 by a conductive strip 21. Both the lead 14 and the lead 15 are electrically connected to the lead frame 54 through a lead 53 and a lead 55, respectively. The chip 12 is mounted on a die pad 51. Thus, electrical contact can be made to the semiconductor chip package 10 via the lead 53 and the lead 55 of the lead frame 54. In the illustrated embodiment, the leads 53 and 55 extend from the side of the encapsulation. In other embodiments, other configurations are possible.

Figure 9A:
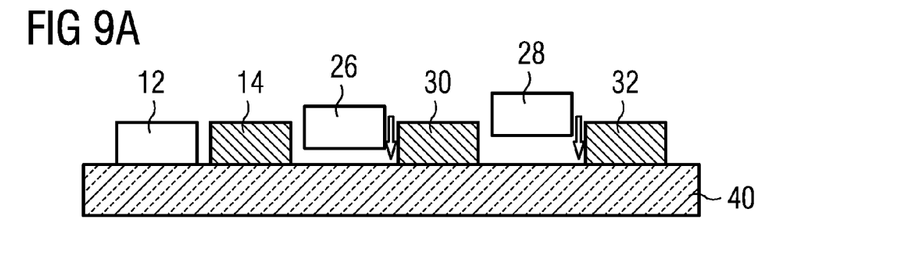
FIGS. 9A-9D are illustrations of another process for packaging semiconductor chips.
Figure 9B:
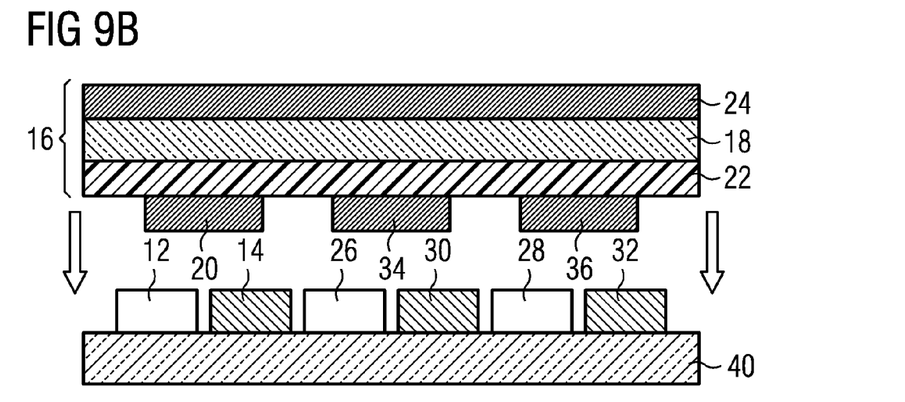
Figure 9C:
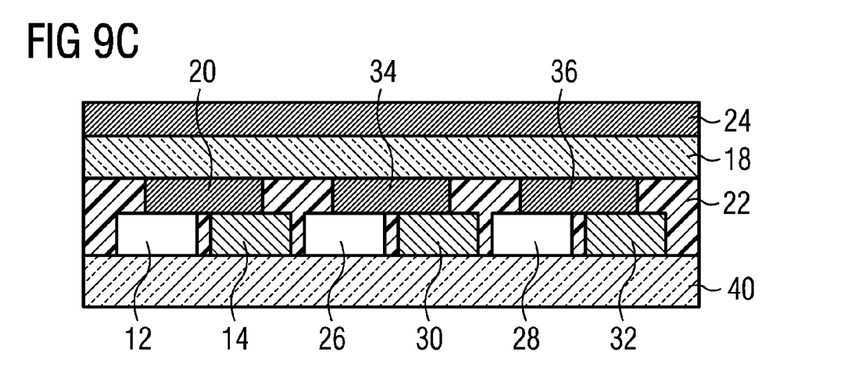

FIGS. 9A-9C schematically illustrate another method for forming the semiconductor chip package 10. In FIG. 9A, the chip 12, the chip 26, and the chip 28 are attached to the carrier 40. In this example, the carrier 40 may be silicon, glass carrier, or some other type of material.

Next, in FIG. 9B, the molding material 16 is aligned over the carrier 40 with the chip 12, the chip 26, the chip 28, the lead 14, the lead 30, and the lead 32. The chip 12, the chip 26, the chip 28 and the lead 14, the lead 30, and the lead 32 have a homogeneous thickness in this illustrative example. As a result, the conductive strip 20, the conductive strip 34, and the conductive strip 36 do not require bending to electrically connect the chip 12, the chip 26, and the chip 28 to the lead 14, the lead 30, and the lead 32, respectively. Moreover, the laminate material in laminate molding layer 22 does not flow between the conductive strips and the leads. In various embodiments, this step can be performed at a temperature between about 150° C. and about 250° C.

In FIG. 9C, the molding material 16 is pressure sintered to the carrier 40 to encapsulate the components and electrically connect the chip 12, the chip 26, and the chip 28 to the lead 14, the lead 30, and the lead 32, respectively, in one shot. In various embodiments, this step can be performed at a temperature between about 150° C. and about 250° C. and pressure between about 0.3 MPa and about 10.0 MPa.

Figure 9D:
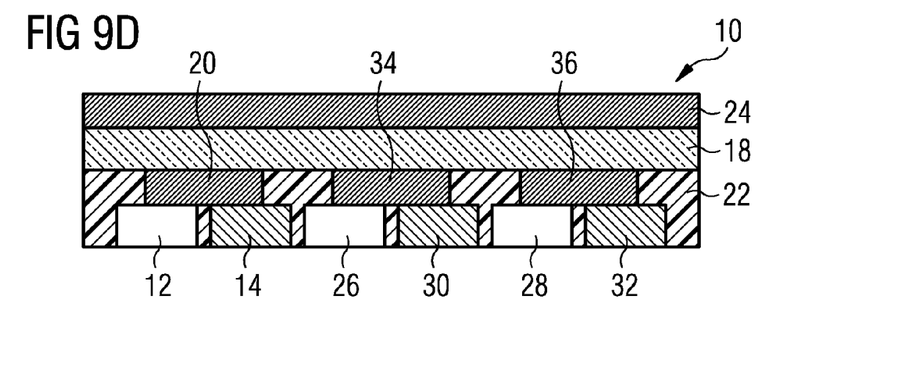

Finally, FIG. 9D illustrates the semiconductor chip package 10 once it has been separated from the carrier 40 through demounting and sawing. Similar to the process described in FIGS. 8A and 8B, no separate wire bonding step is provided. Thus, forming the semiconductor chip package 10 using an illustrative embodiment occurs more quickly and efficiently than using currently available packaging methods.

Figure 10A:
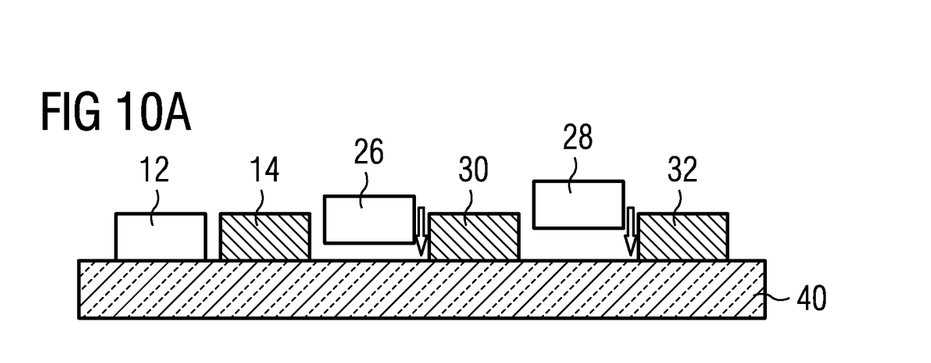
FIGS. 10A-10E are illustrations of a process for packaging semiconductor chips and heat sinks.

FIGS. 10A-10E schematically illustrate a method for forming the semiconductor chip package 10 as shown in FIG. 7. In FIG. 10A, the chip 12, the chip 26, and the chip 28 are cold die bonded to the carrier 40.

Figure 10B:
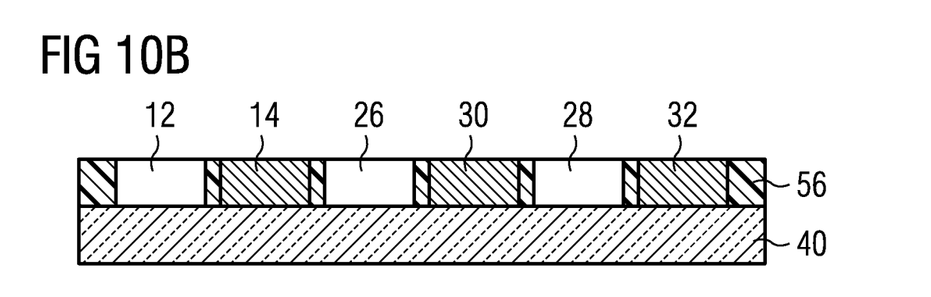

In FIG. 10B, a sacrificial material such as a resist coating 56, is added to the chips and the leads. The resist coating protects the chips and the leads during subsequent processing. In alternative embodiments, the resist coating 56 may be omitted.

Figure 10C:
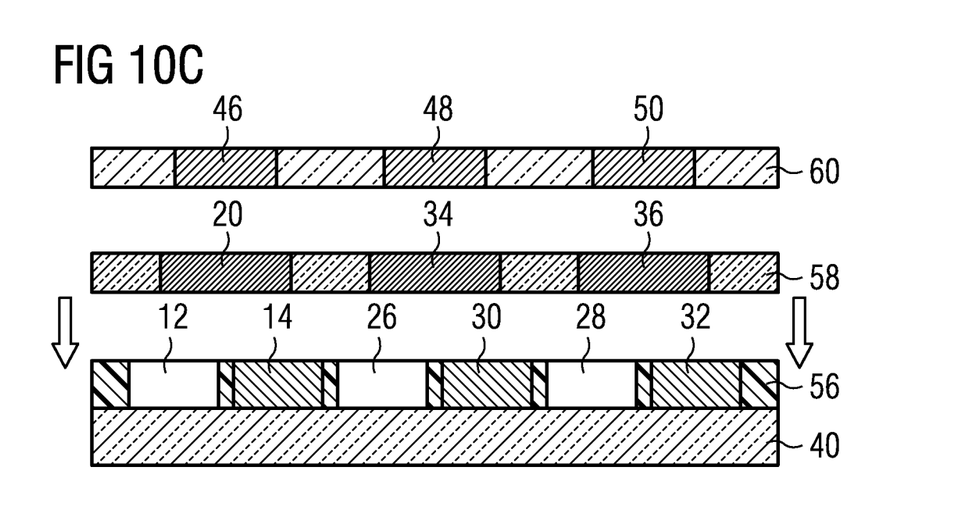

In FIG. 10C, the conductive strip 20, the conductive strip 34, and the conductive strip 36 with resist coating 58 are aligned with the chip 12, the chip 26, the chip 28 and each chip's corresponding lead. Likewise, the heat sink 46, the heat sink 48, and the heat sink 50 with resist coating 60 are aligned with the chips and the leads.

Figure 10D:
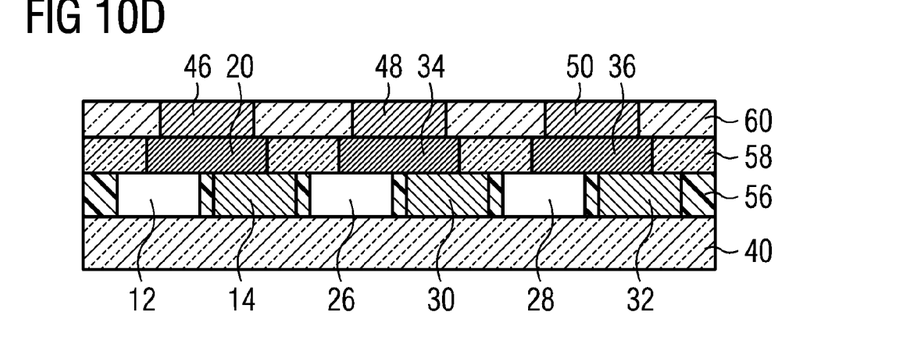

Next, in FIG. 10D, the conductive strip 20, the conductive strip 34, the conductive strip 36 with resist coating 58 and the heat sink 46, the heat sink 48, and the heat sink 50 with resist coating 60 are attached to the chips and the leads. This attachment may occur through batch wafer sintering for the conductive strips and the heat sinks. Batch wafer sintering may be used to achieve consistent thickness for molding.

Figure 10E:
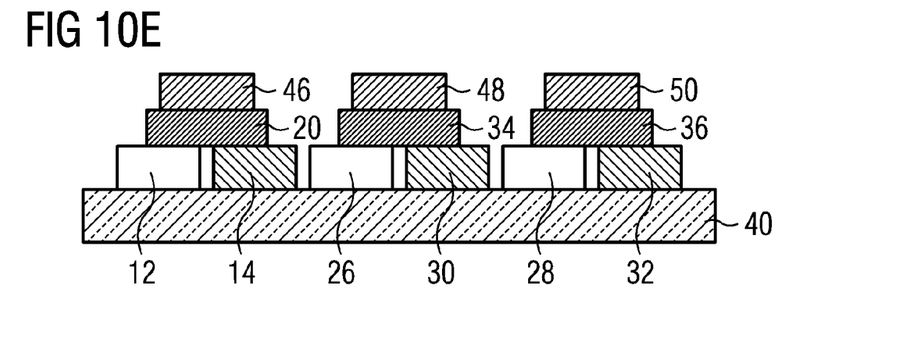

FIG. 10E illustrates the device after etching and resist removal has occurred. As shown in this illustration, resist coating 56, resist coating 58, and resist coating 60 have been removed. The device is now ready for encapsulation using a standard mold encapsulation process. In this process, the molding material 16 does not contain additional conductive strips or other wire bonding material. Further, in some embodiments, the stabilization layer 18 may be omitted from the molding material 16 as well.

Figure 11A:
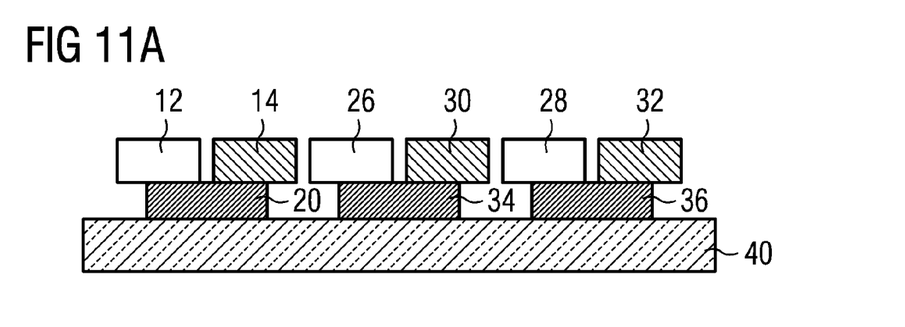
FIGS. 11A and 11B are illustrations of yet another process for packaging semiconductor chips.
Figure 11B:
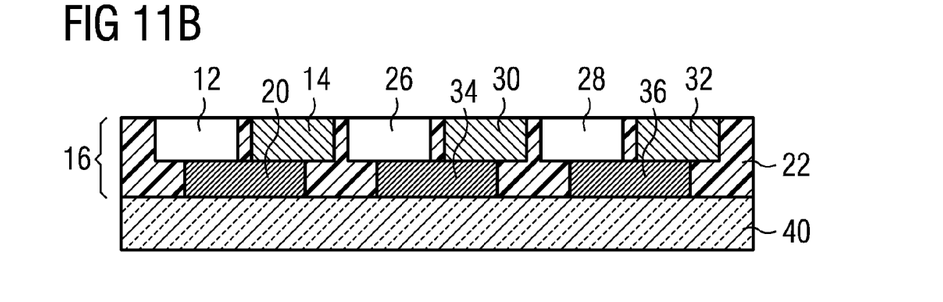

FIGS. 11A and 11B schematically illustrate yet another process for forming the semiconductor chip package 10. In FIG. 11A, an artificial wafer stack is performed with the conductive strip 20, the conductive strip 34, and the conductive strip 36 attached to the carrier 40. The connection to the carrier 40 is made by pressure sintering.

Next, in FIG. 11B, the molding material 16 encapsulates the conductive strips, the chips, and the leads. In this example, the molding material 16 does not contain additional conductive strips. The device may then be sawed to form the semiconductor chip package 10 with a desired number of chips and leads.

Figure 12A:
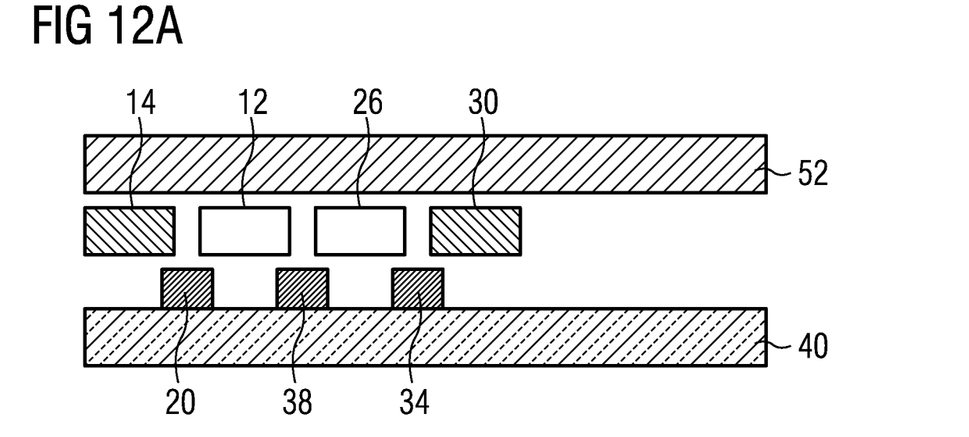
FIGS. 12A and 12B are illustrations of another process for packaging semiconductor chips.
Figure 12B:
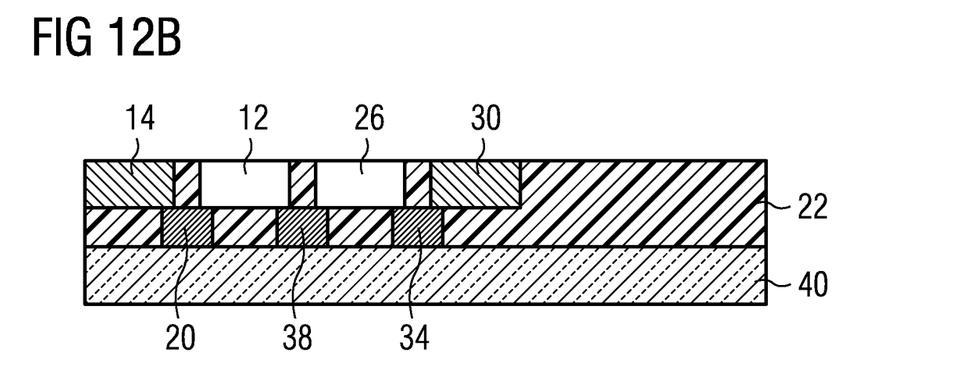

FIGS. 12A and 12B illustrate another method for forming the semiconductor chip package 10. The process shown in this illustration is used to form the semiconductor chip package 10 described in detail in FIG. 3. In particular, this process may be used with multi-chip applications.

In FIG. 12A, the lead 14 and the lead 30 have been formed on a carrier 52. The chip 12 and the chip 26 have also been attached to the carrier 52. Further, the conductive strip 20, the conductive strip 34, the conductive strip 38 have been formed on the carrier 40. The carrier 52 and the carrier 40 are sintered together through a high accuracy super impose process in this illustrative example.

Next, in FIG. 12B, the carrier 52 has been demounted and the molding material 16 has been added to encapsulate the device. The device may then be sawed in a desired manner to form the semiconductor chip package 10 of FIG. 3.

FIGS. 13A and 13B illustrate a plan view of a method for forming the semiconductor chip package 10. Particularly, FIG. 13A shows the carrier 52 with a plurality of leads 64 formed on the carrier 52. In this example, the plurality of leads 64 comprises leads for three semiconductor devices. However, this process may be implemented to form additional semiconductor chip packages at the same time, depending on the particular implementation. As an example, thousands of semiconductor chip packages may be bonding an encapsulated at the same time with the use of an illustrative embodiment.

In FIG. 13B, chips have been attached to the carrier 52. For example, the chip 12 and the chip 26 have been attached to an area 66 on the carrier 52. The area 66 represents the area where the semiconductor chip package 10 from FIG. 3 is formed. Similarly, other chips have been attached to the carrier 52 to begin forming other semiconductor chip packages.

As depicted, the conductive strip 20, conductive strip 34, and conductive strip 38 have been formed in an area 68 on the carrier 40. A plurality of additional conductive strips 70 has also been formed on the carrier 40. The area 68 on the carrier 40 corresponds with the area 66 on the carrier 52. Next, the carrier 52 and the carrier 40 are sintered together, encapsulated, and sawed such that multiple semiconductor chip packages may be formed.

In this manner, the semiconductor chip package 10 shown in FIG. 3 may be formed at substantially the same time as a number of other semiconductor chip packages. Moreover, multiple semiconductor chip packages may be formed eliminating the wire-by-wire, clip-by-clip process that was once implemented to electrically connect chips and leads.

Thus, the present invention provides a method and apparatus for forming a semiconductor chip package in a more efficient and less costly manner. With the use of an illustrative embodiment, the wire bonding process and the encapsulating process occurs at substantially the same time. Various embodiments use a novel molding material containing a bonding component to electrically connect the semiconductor chip to a number of leads and encapsulate the semiconductor chip package in one step, thereby increasing the efficiency of the packaging process. Moreover, various embodiments obviate the need for the wire-by-wire bonding step and allow for one-shot wire bonds for an entire lead frame, panel, or wafer. As a result, various embodiments of the present invention significantly increase the output of semiconductor chip packages.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIG. 1-13 may be combined with each other in various embodiments. It is therefore intended that the appended claims encompass any such modifications or embodiments.

What is claimed is:

1. A method for packaging a semiconductor device, the method comprising:
   attaching a chip to a lead frame;
   aligning a molding material on the lead frame and the chip, wherein the molding material comprises a stabilization layer, a laminate molding layer connected to the stabilization layer, and a plurality of conductive strips connected to the laminate molding layer such that each conductive strip is aligned with a respective contact area on the chip; and
   encapsulating the chip and the lead frame by attaching the molding material to the lead frame and the chip such that ones of the conductive strips electrically connect the chip to leads of the lead frame.

2. The method of claim 1, wherein an additional chip is attached to the lead frame and wherein the encapsulating further comprises encapsulating the additional chip.

3. The method of claim 2, wherein the chip and the additional chip are electrically connected to each other by a conductive strip of the plurality of conductive strips.

4. The method of claim 1, further comprising bending a portion of the conductive strip.

5. The method of claim 4, wherein the bending occurs during the encapsulating step.

6. The method of claim 1, wherein the stabilization layer comprises fiberglass.

7. The method of claim 1, wherein the conductive strip comprises copper.

8. The method of claim 1, wherein the encapsulating step comprises pressure sintering the laminate molding layer.

9. The method of claim 1, wherein the molding material comprises a conductive layer connected to the stabilization layer such that the stabilization layer is located between the conductive layer and the laminate molding layer.

10. The method of claim 1, wherein the laminate molding layer surrounds the stabilization layer.

11. A method for packaging a semiconductor device, the method comprising:

providing a carrier with a plurality of conductive strips attached thereto;

attaching the conductive strips between contact areas of a chip and leads;

removing the carrier;

encapsulating the chip and the conductive strips with a molding material to form a semiconductor chip package;

providing a chip carrier that includes the chip and the leads;

before attaching the conductive strips, applying a sacrificial coating to the chip and the leads on the chip carrier; and after attaching the conductive strips, removing the sacrificial coating.

12. The method of claim 11, wherein attaching the conductive strips comprises using a pressure sintering process.

13. The method of claim 11, wherein the carrier comprises a porous metal.

14. A method for packaging a semiconductor device, the method comprising:

forming a plurality of leads on a chip carrier;

placing a plurality of chips on the chip carrier;

aligning a strip carrier with the chip carrier, wherein
the strip carrier comprises conductive strips and a coating material, and
the strip carrier is aligned with the chip carrier such that the conductive strips of the strip carrier are aligned to electrically connect contact regions of the chips with respective ones of the leads;

attaching the strip carrier to the chip carrier such that the coating material of the strip carrier encapsulates the chips and so that the conductive strips electrically connect the contact regions of the chips with the respective ones of the leads; and removing the chip carrier so as to expose a portion of each of the leads.

15. The method of claim 14, further comprising singulating the encapsulated chips.

16. The method of claim 14, wherein placing the chips on the chip carrier comprises cold die attaching the chips to the chip carrier.

17. The method of claim 14, wherein the coating material comprises a stabilization layer and a laminate molding layer connected to the stabilization layer.

18. A method for packaging a semiconductor device, the method comprising:

providing a chip including a contact area;

providing a lead; and forming an encapsulant, the encapsulant comprising a stabilization layer, a laminate molding layer connected to the stabilization layer and a conductive strip connected to the laminate molding layer, wherein the conductive strip electrically connects the contact area of the chip to the lead.

19. The method of claim 18, wherein the laminate molding layer surrounds the stabilization layer.

20. The method of claim 18, further comprising:

providing a plurality of additional chips, each chip having a contact area;

providing a plurality of additional leads; and forming a plurality of additional conductive strips coupling each additional lead to a respective contact area.

21. The method of claim 18, further comprising electrically connecting a first chip in the plurality of additional chips to a second chip in the plurality of additional chips with a second conductive strip.

22. The method of claim 18, wherein the stabilization layer comprises fiberglass.

23. The method of claim 18, wherein the conductive strip comprises a copper strip.

* * * * *